(12) United States Patent
Krutsick

(10) Patent No.: US 7,605,010 B1
(45) Date of Patent: Oct. 20, 2009

(54) INTEGRATED SILICON OPTICAL ISOLATOR

(75) Inventor: Thomas Joseph Krutsick, Fleetwood, PA (US)

(73) Assignee: Zarlink Semiconductor US, Inc., Austin, TX (US)

( * ) Notice: Subject to any disclaimer, the term of this patent is extended or adjusted under 35 U.S.C. 154(b) by 29 days.

(21) Appl. No.: 12/122,771

(22) Filed: May 19, 2008

(51) Int. Cl.
*H01L 21/00* (2006.01)
*H01L 27/15* (2006.01)

(52) U.S. Cl. .......................... 438/22; 257/82
(58) Field of Classification Search ............ 438/22, 438/24; 257/80, 82
See application file for complete search history.

(56) References Cited

U.S. PATENT DOCUMENTS

| | | | |
|---|---|---|---|
| 4,884,112 A | 11/1989 | Lorenzo et al. | 357/17 |
| 5,438,210 A * | 8/1995 | Worley | 257/82 |
| 7,180,098 B2 * | 2/2007 | Speyer et al. | 257/82 |

OTHER PUBLICATIONS

Picosecond Photoconductivity by Robert B. Hammond Fall 1986 Los Alamos Science pp. 48-65.

* cited by examiner

*Primary Examiner*—Calvin Lee
(74) *Attorney, Agent, or Firm*—Williams, Morgan & Amerson PC

(57) ABSTRACT

The present invention provides an optical isolator and a method of forming the optical isolator. Embodiments of the optical isolator include a silicon layer having at least one trench formed therein. The trench has a resistance that varies in response to electromagnetic radiation. Embodiments of the optical isolator also include at least one first diode formed in the silicon layer such that the trench encompasses the first diode. The first diode is configured to generate electromagnetic radiation in response to an applied signal. Embodiments of the optical isolator further include first and second regions formed in contact with the trench such that the resistance between the first and second contact regions varies in response to the electromagnetic radiation generated by the first diode.

18 Claims, 4 Drawing Sheets

INTEGRATED SILICON OPTICAL ISOLATOR

CROSS REFERENCE TO RELATED APPLICATIONS

This application is related to U.S. patent application Ser. No. 12/061,085, filed on Apr. 2, 2008 entitled, "A LIGHT ACTIVATED SILICON CONTROLLED SWITCH." This application is also related to U.S. patent application Ser. No. 12/046,642, filed on Mar. 12, 2008 entitled, "A PROTECTION CIRCUIT FOR A SUBSCRIBER LINE INTERFACE CIRCUIT." This application is likewise related to U.S. patent application Ser. No. 12/046,683, filed on Mar. 12, 2008 entitled "AN OPTICALLY TRIGGERED ELECTROSTATIC DISCHARGE PROTECTION CIRCUIT."

BACKGROUND OF THE INVENTION

1. Field of the Invention

This invention relates generally to semiconductor devices, and, more particularly, to semiconductor devices that include radiating diodes.

2. Description of the Related Art

Silicon diodes (or diodes formed of other materials) can act as a source of electromagnetic radiation. For example, a silicon diode can be forward biased so the current begins to flow through the diode. Energy dissipated in the diode while the current is flowing can generate electronic radiation. However, the generation of radiation is relatively inefficient when the diode is forward biased. The silicon diode can generate visible electromagnetic radiation when the diode is reverse, or avalanche, biased. An optical isolator can be formed using the silicon diode as an emitting device that provides electromagnetic radiation to a receiving device. However, forming the optical isolator from separate emitting and receiving devices may consume a relatively large area on a silicon die or wafer.

The disclosed subject matter is directed to addressing the effects of one or more of the problems set forth above.

SUMMARY OF THE INVENTION

The following presents a simplified summary of the disclosed subject matter in order to provide a basic understanding of some aspects of the disclosed subject matter. This summary is not an exhaustive overview of the disclosed subject matter. It is not intended to identify key or critical elements of the disclosed subject matter or to delineate the scope of the disclosed subject matter. Its sole purpose is to present some concepts in a simplified form as a prelude to the more detailed description that is discussed later.

In embodiments described herein, an optical isolator and a method of forming the optical isolator are provided. Embodiments of the optical isolator include a silicon layer having at least one trench formed therein. A portion of the trench is formed of a material that has a resistance that varies in response to electromagnetic radiation. Embodiments of the optical isolator also include at least one first diode formed in the silicon layer such that the trench encompasses the first diode. The first diode is configured to generate electromagnetic radiation in response to an applied signal. Embodiments of the optical isolator further include first and second regions formed in contact with the trench such that the resistance between the first and second contact regions varies in response to the electromagnetic radiation generated by the first diode.

BRIEF DESCRIPTION OF THE DRAWINGS

The disclosed subject matter may be understood by reference to the following description taken in conjunction with the accompanying drawings, in which like reference numerals identify like elements, and in which.

Figure 1:
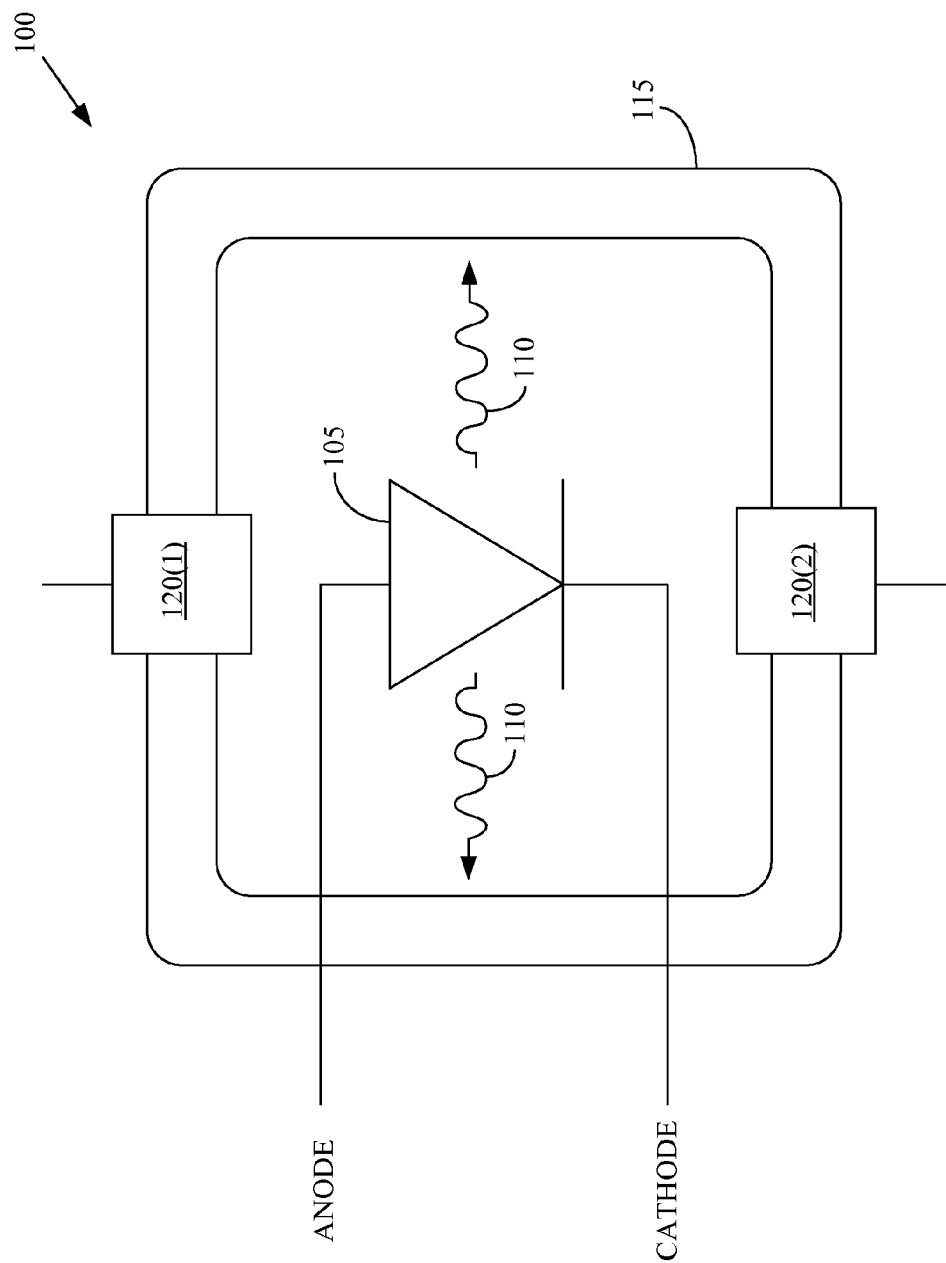
FIG. 1 conceptually illustrates a first exemplary embodiment of an optical isolator.

While the disclosed subject matter is susceptible to various modifications and alternative forms, specific embodiments thereof have been shown by way of example in the drawings and are herein described in detail. It should be understood, however, that the description herein of specific embodiments is not intended to limit the disclosed subject matter to the particular forms disclosed, but on the contrary, the intention is to cover all modifications, equivalents, and alternatives falling within the scope of the appended claims.

DETAILED DESCRIPTION OF SPECIFIC EMBODIMENTS

Illustrative embodiments are described below. In the interest of clarity, not all features of an actual implementation are described in this specification. It will of course be appreciated that in the development of any such actual embodiment, numerous implementation-specific decisions should be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The disclosed subject matter will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the disclosed subject matter. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

FIG. 1 conceptually illustrates a first exemplary embodiment of an optical isolator 100. In the illustrated embodiment, the optical isolator 100 includes a silicon diode 105 that may be formed in a silicon layer deposited over a substrate. Silicon diodes 105 of these types may be incorporated into the design of a device or system for use in silicon integrated circuits, as discussed herein. In various embodiments, the silicon diode 105 may generate electromagnetic radiation 110 by various processes depending on the structure of the silicon diode 105. For example, a simple p-n junction diode may be used as an emitter of optical and near infrared photons. Other examples of silicon diodes or other emitters that may be implemented in the optical isolator 100 include diodes formed using porous silicon, engineered defects, hybrid (doped) materials, anti-fuses, and/or nano-crystal designs.

The silicon diode 105 integrated into a silicon integrated circuit may generate photons by several physical mechanisms. Examples include generation of high energy photons by hole-electron recombination/annihilation, generation of 1050 nm wavelength photons by interband emission from forward biasing the diode 105, generation of 650 nm photons by intraband emission due to avalanche or reverse biasing the diode 105, bremsstrahlung radiation, thermal generation of IR-to-visible wavelength photons, and intermittent generation of photons by the spark gap phenomena. Thus, in various embodiments, the p-n junction diode 105 may be operated in forward bias or in reverse breakdown (avalanche mode) to get the required emissions. Thermal emission may also be generated when a lot of current passes through the junction and heats up the local area. However, persons of ordinary skill in the art having benefit of the present disclosure should appreciate that the particular physical mechanisms described herein are meant to be illustrative and not to limit the disclosed subject matter to the particular mechanisms for generating electromagnetic radiation using the silicon diode 105.

The silicon diode 105 is physically and electrically isolated by a portion of a trench 115, which may be formed in the layer or layers that include the material used to form the diode 105. The trench 115 is formed so that the resistance of at least a portion of the trench varies in response to the presence of electromagnetic radiation. In one embodiment, portions of the trench 115 may be formed of a photoconductive material so that the resistance of the material decreases (and the conductivity of the material increases) as the intensity of electromagnetic radiation in the appropriate frequency range increases. For example, portions of the trench 115 may be formed of a semiconductor material that has an energy level structure including a valence band and a conduction band that are separated by a band gap including-forbidden electronic energy levels. The conduction band may be populated with electrons when the material is irradiated by electromagnetic radiation at frequencies or energies that are equal to or greater than the energy that is required to excite electrons from the valence band over the band gap and into the conduction band. Increasing the number of electrons in the conduction band also increases the conductivity of the material and decreases its resistance.

Contacts 120(1-2) may be formed to contact the trench 115 at different locations. In one embodiment, the contacts 120 are formed of a conductive material that is in electrical contact with the trench 115. The contacts 120 may also include a doped portion, as will be discussed herein. The contacts 120 and the trench 115 may be used to detect the state of the diode 105. For example, the diode 105 may generate electromagnetic radiation 110 if the diode 105 is forward biased by applying an appropriate signal to the anode and cathode. The electromagnetic radiation 110 may cause the resistance of the photoconductive portion of the trench 115 to decrease and the decrease in the resistance can be detected, e.g., by applying a voltage over the contacts 120 and monitoring the change in the resulting current. Alternatively, the diode 105 may generate electromagnetic radiation 110 if the diode 105 is reverse biased at a sufficiently high voltage. Moreover, if portions of the contacts 120 are appropriately doped and portions of the trench 115 are lightly doped, then the contacts 120 and portions of the trench 115 may form a PIN diode that can be used to detect the state of the diode 105.

Figure 2:
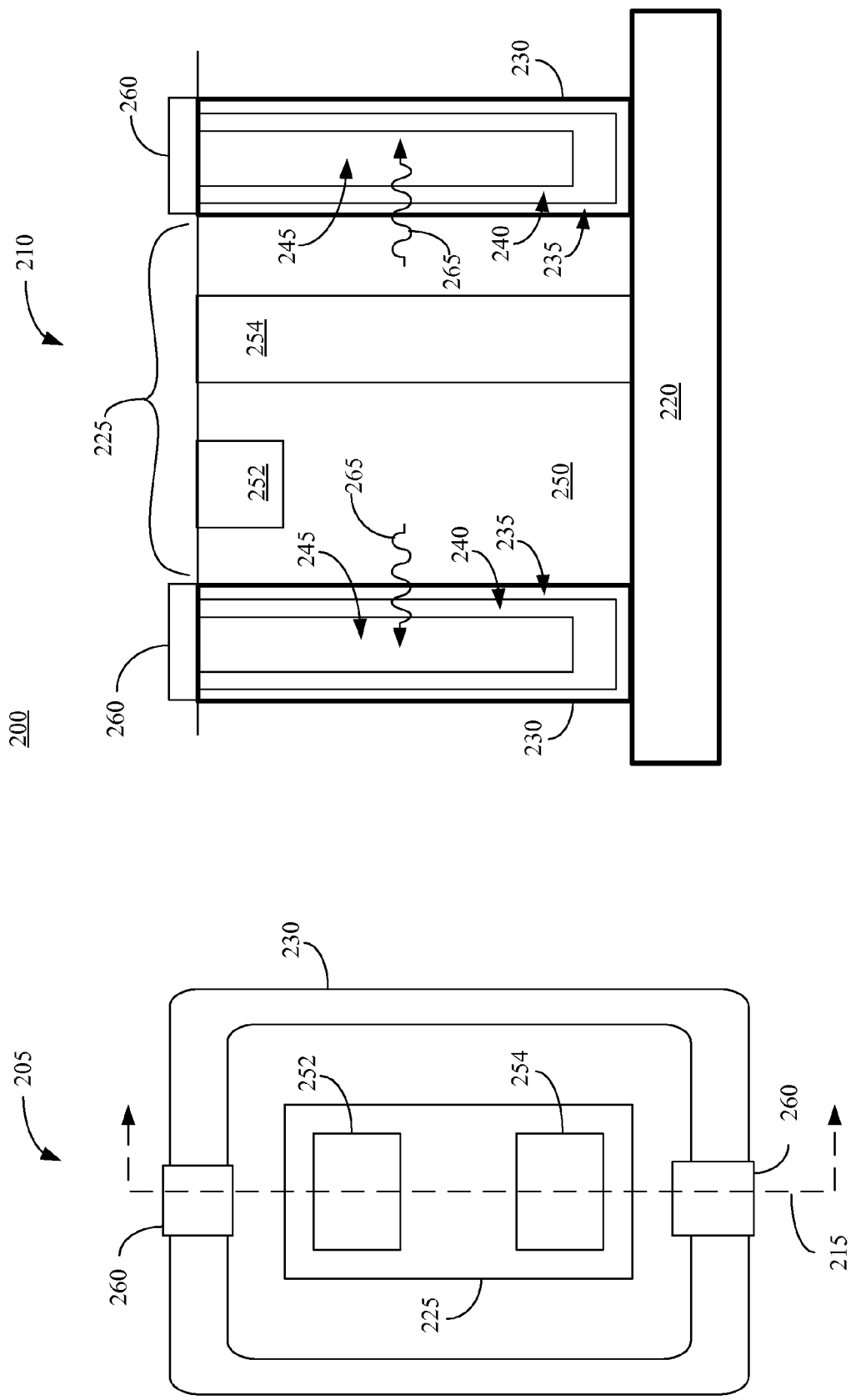
FIG. 2 conceptually illustrates top-down and cross-sectional views of a second exemplary embodiment of an optical isolator.

FIG. 2 conceptually illustrates a second exemplary embodiment of an optical isolator 200. A top-down view 205 of the optical isolator 200 is shown on the left-hand side of FIG. 2 and a cross-section view 210 is shown on the right-hand side of FIG. 2. The cross-section view 210 is taken along the axis 215. In the illustrated embodiment, the optical isolator 200 is formed over a substrate 220. The substrate 220 may be a portion of a silicon wafer or it may include other layers formed in, on, over, and/or adjacent the silicon wafer. For example, the substrate 220 may be a silicon-on-insulator (SOI) substrate. Silicon-on-insulator (SOI) devices may be characterized by having a thin layer of insulating dielectric material (for example, a buried oxide or nitride or other suitable insulating layer) sandwiched between a bulk semiconductor substrate and the circuit elements of the device. Typically, no other layers of material are interposed between the buried dielectric layer and the bulk substrate although the disclosed subject matter is not limited to this structure. In a silicon-on-insulator (SOI) device, the circuit elements above the buried dielectric layer are established in regions of a thin film of substantially monocrystalline semiconductor layer, often bonded and/or grown epitaxially, that are separated from each other by insulating dielectric regions (of field oxide, for example). The (epitaxial) semiconductor layer may be n-doped or p-doped as appropriate with N-type or P-type conductivity dopants. For example, the (epitaxial) semiconductor layer may include a body region having a P-type dopant, the body region being disposed between source/drain regions.

In the illustrated embodiment, the optical isolator 200 includes a silicon diode 225 encompassed by a trench 230. The elements 225, 230 shown in FIG. 2 are formed in a silicon layer (not indicated by a separate numeral). The trench 230 includes an oxide layer 235 and a nitride layer 240, although other layers may also be included in other embodiments. Alternatively, the dielectric portion of the trench 230 may only include the oxide layer 235. A polysilicon fill 245 is formed in the trench 230. For example, the silicon layer may be etched to form the trench 230 and then a dielectric (or stack of dielectrics) can be deposited on the walls of the trench 230. The poly fill 245, which may be doped or undoped, is used to fill the remaining opening in the trench 230. In the illustrated embodiment, the polysilicon fill 245 is a photoconductive material. Persons of ordinary skill in the art having benefit of the present disclosure should appreciate that the embodiment depicted in FIG. 2 is intended to be illustrative and not to limit the disclosed subject matter. In alternative embodiments, additional layers or elements may be formed using additional processing steps known to persons of ordinary skill in the art.

The silicon diode 225 is formed in an n-type region 250, which can be formed by doping a portion of the silicon layer with an n-type dopant. For example, n-type material may be deposited over the substrate 220. The n-type material may be an n-type epitaxial layer or arsenic doped as it is deposited. A small buried n layer may be formed at the bottom of the diode 225 (i.e., near the substrate 220). By applying a relatively high temperature for a relatively long diffusion time, the buried layer may be diffused out to cover the whole bottom of the diode 225. In this case, the n-type region 250 has a relatively high concentration of dopants near the substrate 220 and a relatively lower concentration of dopants near the top of the diode 225. However, persons of ordinary skill in the art having benefit of the present disclosure should appreciate that other techniques for forming the n-type region 250 may be used. The silicon diode 225 also includes a p-type region 252 and an n-type region 254 that is more highly doped than the n-type region 250. Techniques for forming the regions 250, 252, 254, such as dopant implantation/diffusion and/or epitaxy, are known in the art and in the interest of clarity will not be discussed further herein. Furthermore, persons of ordinary skill in the art having benefit of the present disclosure should appreciate that the disclosed subject matter is not limited to this particular structure for the silicon diode 225 or this particular polarity for the regions 250, 252, 254. In alternative embodiments, other structures and/or the opposite polarity may be used, e.g., n-type and p-type may be reversed.

In the illustrated embodiment, contacts 260 are formed over the filled trench 230 to provide electrical contact to the trench 230. The contacts 260 can be formed using any appropriate material. For example, the contacts 260 may be formed by depositing polysilicon through an opening in an oxide layer or other passivation layer (not shown in FIG. 2) so that the contacts 260 are in physical contact with the poly fill 245. Contacts (not shown in FIG. 2) to the regions 252, 254 may also be used to bias the silicon diode 225 so that the diode 210 generates electromagnetic radiation 255. The contacts 260 may be used to detect the activity state of the diode 225. For example, the silicon diode 225 may generate electromagnetic radiation 265 when a biasing signal is applied to the regions 252, 254. The electromagnetic radiation 265 may change the conductivity and/or resistance of the photoconductive polysilicon fill 245. This change in conductivity and/or resistance can be detected by applying a voltage across the contacts 260 and detecting a change in the resulting current. However, persons of ordinary skill in the art having benefit of the present disclosure should appreciate that other techniques for operating the optical isolator 200 may be used.

Figure 3:
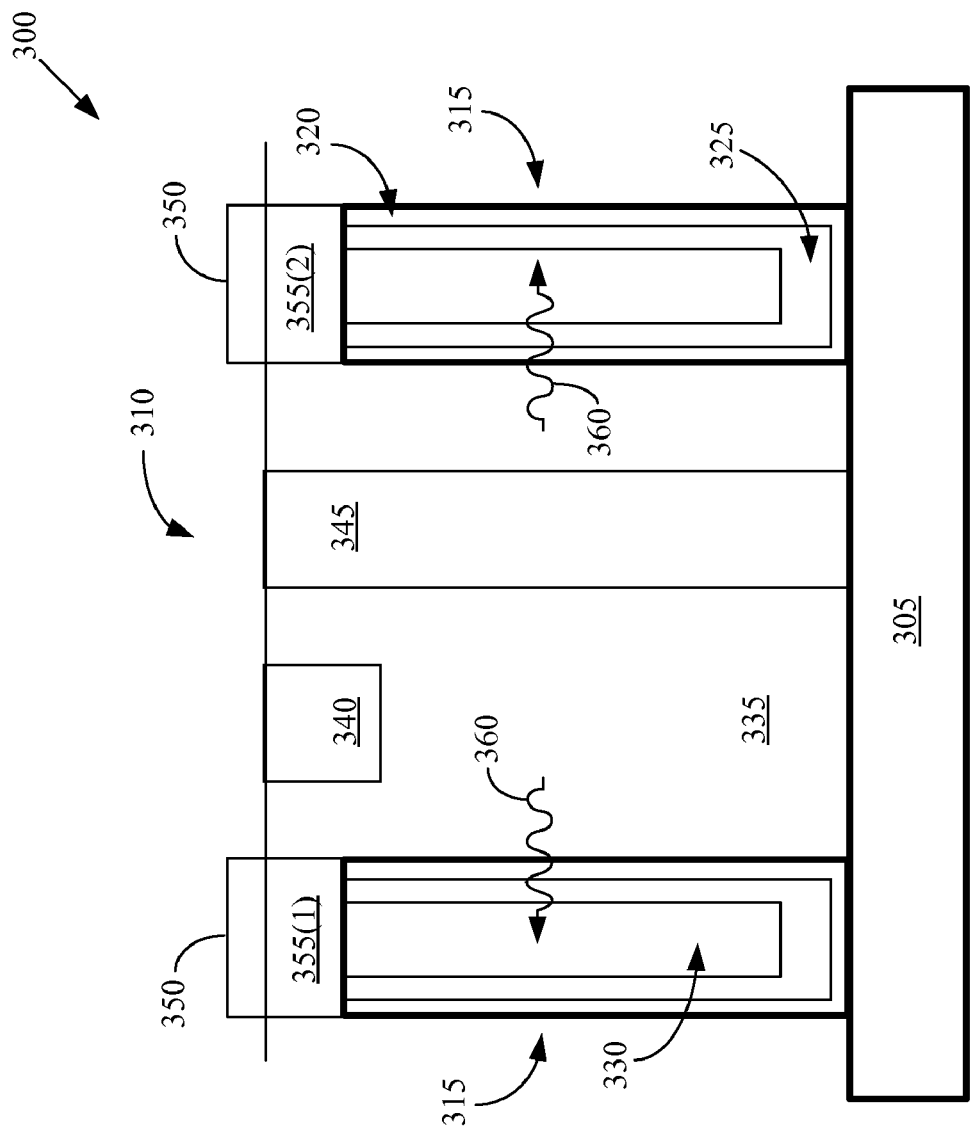
FIG. 3 conceptually illustrates a cross-sectional view of a third exemplary embodiment of an optical isolator.

FIG. 3 conceptually illustrates a cross-sectional view of a third exemplary embodiment of an optical isolator 300. The cross-sectional view of a third exemplary embodiment of the optical isolator 300 may be taken along the axis 215 shown in FIG. 2 and so some of the elements of the optical isolator 300 may be analogous to elements of the optical isolator 200 shown in FIG. 2. For example, the optical isolator 300 is formed over a substrate 305 that may be a portion of a silicon wafer or it may include other layers formed in, on, over, and/or adjacent a silicon wafer or silicon-on-insulator (SOI) substrate. The optical isolator 300 also includes a silicon diode 310 encompassed by a trench 315 formed in a silicon layer. The trench 315 includes an oxide layer 320 and a nitride layer 325, although other layers may also be included in other embodiments. A polysilicon fill 330, which may be doped or undoped, is formed in the trench 315. The silicon diode 310 is formed in an n-type region 335, which can be formed by doping a portion of the silicon layer with an n-type dopant. The silicon diode 310 also includes a p-type region 340 and an n-type region 345 that is more highly doped than the n-type region 335. In alternative embodiments, other structures and/or the opposite polarity may be used, e.g., n-type and p-type may be reversed. Contacts 350 are formed over the filled trench 315.

The third exemplary embodiment of the optical isolator 300 differs from the second exemplary embodiment by including doped regions 355(1-2) formed beneath the contacts 350. In various alternative embodiments, the doped regions 355 may be formed using implantation and/or deposition techniques. For example, the doped region 355(1) can be formed by doping with a p-type dopant and the doped region 355(2) can be formed by doping with an n-type dopant. In this case, the contacts 350, the doped regions 355, and portions of the trench 315 form a PiN diode that may be used to detect the activity state of the diode 310. For example, the silicon diode 310 may generate electromagnetic radiation 360 when a biasing signal is applied to the regions 340, 345. The electromagnetic radiation 360 may generate electron-hole pairs in the photoconductive polysilicon fill 330. The resulting change in the diode current (from the electron-hole pairs) can be detected using the PiN diode formed by the contacts 350, the doped regions 355, and portions of the trench 315. However, persons of ordinary skill in the art having benefit of the present disclosure should appreciate that other techniques for operating the optical isolator 300 may be used.

Figure 4:
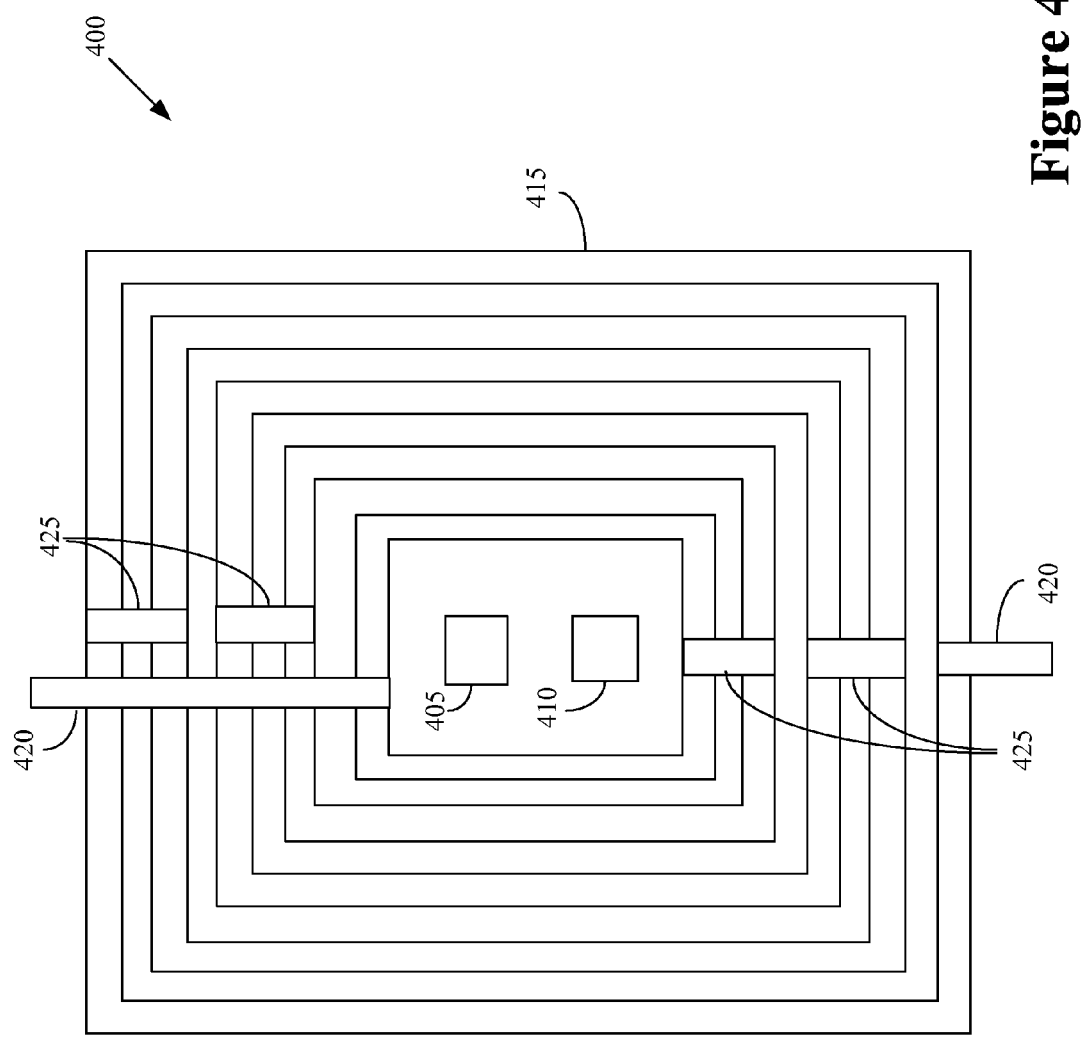
FIG. 4 conceptually illustrates a fourth exemplary embodiment of an optical isolator.

FIG. 4 conceptually illustrate a fourth exemplary embodiment of an optical isolator 400. In the fourth exemplary embodiment, the optical isolator 400 includes a diode including doped regions 405, 410. Biasing the diode across the doped regions 405, 410 may result in electromagnetic radiation being emitted by the diode, as discussed herein. The fourth exemplary embodiment of the optical isolator 400 differs from the first, second, and third embodiment by encompassing the diode in multiple trenches 415. In the illustrated embodiment, the trenches 415 are approximately concentric and the center of the trenches 415 coincides approximately with a center of the diode. However, persons of ordinary skill in the art having benefit of the present disclosure should appreciate that other configurations of the trenches 415, which may include more or fewer trenches 415, may be used.

Contacts 420 are formed to contact regions of the trenches 415. In the illustrated embodiment, the contacts 420 may also be used to electrically couple the trenches 415 so that the trenches 415 are coupled in series. Additional conductive regions 425 may also be formed to couple two or more of the trenches 415 in series. As discussed herein, optical isolator 400 may also include doped regions beneath the contacts 420 to form diode elements. Including additional trenches 415 may allow more of the electromagnetic radiation generated by the diode to be captured and may therefore improve the sensitivity of the optical isolator 400 relative to optical isolators that include only a single trench encompassing the diode. Increases in the sensitivity of the optical isolator 400 may depend upon the transmission and/or reflection properties of side walls of the additional trenches 415.

The particular embodiments disclosed above are illustrative only, as the disclosed subject matter may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed:

1. A method of forming an optical isolator, comprising:
    forming at least one trench formed in a silicon layer, said at least one trench having a resistance or current that varies in response to electromagnetic radiation;
    forming at least one first diode in the silicon layer such that said at least one trench encompasses said at least one first diode, said at least one first diode being configured to generate electromagnetic radiation in response to an applied signal; and forming first and second regions in contact with said at least one trench such that the resistance between the first and second contact regions varies in response to the electromagnetic radiation generated by said at least one first diode.

2. The method of claim 1, comprising depositing, in the trench, a conductive or resistive material having a resistance that varies in response to electromagnetic radiation.

3. The method of claim 2, comprising forming at least one insulating layer within the trench.

4. The method of claim 3, comprising:
forming at least one oxide layer adjacent the walls of the trench;
forming at least one nitride layer within said at least one oxide layer; and
depositing polysilicon material within at least one oxide layer and at least one nitride layer.

5. The method of claim 1, wherein forming said at least one trench comprises forming a plurality of trenches that each encompass said at least one first diode.

6. The method of claim 1, wherein forming said at least one first diode comprises forming a first region using a dopant of a first type and a second region using a dopant of a second type opposite to the first type, the first and second regions being formed in a layer doped using a dopant of the first type.

7. The method of claim 1, comprising doping the first region using a dopant of a first type and doping the second region using a dopant of a second type opposite to the first type.

8. The method of claim 1, comprising forming a second diode comprising the first region, portions of the trench, and the second region.

9. The method of claim 8, wherein forming the second diode comprises forming a PIN diode.

10. An optical isolator, comprising:
a silicon layer having at least one trench formed therein, said at least one trench having a resistance that varies in response to electromagnetic radiation;
at least one first radiating element formed in the silicon layer such that said at least one trench encompasses said at least one first diode, said at least one first radiating element being configured to generate electromagnetic radiation in response to an applied signal; and
first and second regions formed in contact with said at least one trench such that the resistance or current between the first and second contact regions varies in response to the electromagnetic radiation generated by said at least one first radiating element.

11. The optical isolator of claim 10, wherein said at least one trench comprises a conductive or resistive material having a resistance that varies in response to electromagnetic radiation.

12. The optical isolator of claim 11, wherein said at least one trench comprises at least one insulating layer.

13. The optical isolator of claim 12, wherein said at least one trench comprises polysilicon material formed within at least one oxide layer and at least one nitride layer.

14. The optical isolator of claim 10, wherein said at least one trench comprises a plurality of trenches encompassing said at least one first radiating element.

15. The optical isolator of claim 10, wherein said at least one first radiating element comprises a diode formed of a first region formed using a dopant of a first type and a second region formed using a dopant of a second type opposite to the first type, the first and second regions being formed in a layer doped using a dopant of the first type.

16. The optical isolator of claim 10, wherein the first region is doped using a dopant of a first type and the second region is doped using a dopant of a second type opposite to the first type.

17. The optical isolator of claim 10, wherein the first region, portions of the trench, and the second region form a portion of a second radiating element.

18. The optical isolator of claim 17, wherein the second radiating element is a PIN diode.

* * * * *